United States Patent [19]
Shimizu et al.

[11] Patent Number: 6,064,418
[45] Date of Patent: May 16, 2000

[54] LED ARRAY, PRINT HEAD, AND ELECTROPHOTOGRAPHIC PRINTER

[75] Inventors: Takatoku Shimizu; Mitsuhiko Ogihara; Masumi Taninaka; Hiroshi Hamano, all of Tokyo, Japan

[73] Assignee: Oki Data Corporation, Tokyo, Japan

[21] Appl. No.: 09/057,611

[22] Filed: Apr. 9, 1998

[30]     Foreign Application Priority Data

Apr. 14, 1997  [JP]  Japan ..................................... 9-095726
Oct. 28, 1997  [JP]  Japan ..................................... 9-295550

[51] Int. Cl.$^7$ ....................................................... B41J 2/45
[52] U.S. Cl. ........................................... 347/238; 347/130
[58] Field of Search ................................... 347/238, 129, 347/130; 250/494.1

[56]             References Cited

U.S. PATENT DOCUMENTS 5,946,022   8/1999   Kamimura ............................... 347/238

OTHER PUBLICATIONS

Yoshihiro Takekida, "Design of Optical Printers", Triceps, 1985, pp. 121–133.

*Primary Examiner*—Richard Moses
*Attorney, Agent, or Firm*—Venable; Robert J. Frank

[57]                ABSTRACT

In an array of light-emitting diodes formed by diffusion of an impurity into a semiconductor substrate, the width of the diodes in the array direction is between four-tenths and five-tenths of the array pitch. The width of the windows above the diodes is between three-tenths and four-tenths of the array pitch. Between one-fourth and one-half of the surface area of each diode is covered by an electrode making contact with the diode through the window. The distance from the centers of the light-emitting diodes at the ends of the array to the edges of the substrate is between twenty-five and sixty-five hundredths of the array pitch.

42 Claims, 16 Drawing Sheets

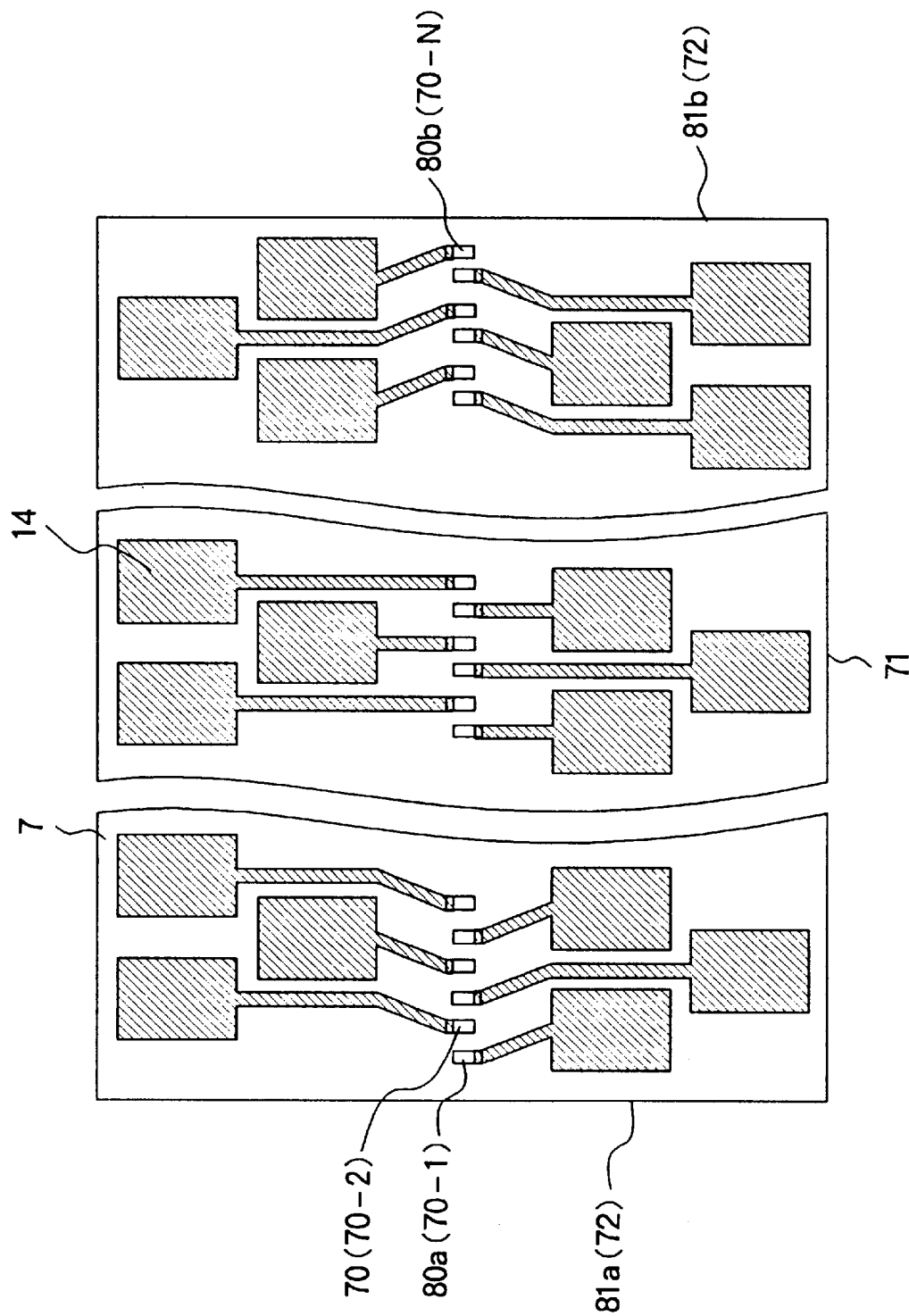

LED ARRAY, PRINT HEAD, AND ELECTROPHOTOGRAPHIC PRINTER

BACKGROUND OF THE INVENTION

The present invention relates to an electrophotographic printer, to a print head that illuminates a photosensitive drum in the electrophotographic printer, and to an array of light-emitting diodes used as light sources in the print head; more particularly to a printer, print head, and array with a resolution of one thousand two hundred dots per inch (1200 DPI).

The background art will be briefly described with reference to FIGS. 19 to 21. FIG. 19 shows an oblique view of a typical array of light-emitting diodes or LEDs 1. The LEDs 1 are formed in an n-type compound semiconductor substrate 2 covered by a transparent insulating film 3. Each LED 1 has an electrode 4 leading to a window 6 in the insulating film 3. A pn junction is created by diffusion of a p-type impurity through the window 6. Referring to FIG. 20, diffusion proceeds laterally as well as vertically, so the surface extent 7 of the p-type diffusion region extends beyond the edges of the window 6. Light is emitted from the entire surface extent 7 of the p-type diffusion region, and passes substantially unobstructed through the insulating film 3, but part of the surface extent 7a is covered by the electrode 4, which is opaque.

The electrode 4 makes contact with the surface of the p-type diffusion region in a contact region 6a inside the window 6. The contact can be seen more clearly in FIG. 21, which is a sectional view through line C–C' in FIG. 20. FIG. 21 also shows the n-type substrate 2, the p-type (diffusion region 8, a common electrode 9 disposed on the underside of the substrate 2, and the pn junction 5 between the p-type and n-type regions.

LED arrays of the type shown in FIGS. 19 to 21 are used as light sources in the print, heads of electrophotographic printers. In a conventional printer with a resolution of, say, four hundred dots per inch (400 DPI), the array pitch is sixty-three micrometers (63 $\mu$m). Each window 6 is about thirty micrometers wide and about forty micrometers long (30 $\mu$m×40 $\mu$m). The surface extent 7 of the p-type diffusion region 8 is about forty micrometers wide and about fifty micrometers long (40 $\mu$m×50 $\mu$m). The contact region 6a must be large enough so that the electrical resistance between the electrode 4 and the p-type diffusion region 8 is not too high. The contact region 6a has a surface area of, for example, one hundred fifty square micrometers (150 $\mu$m$^2$). The covered part 7a accounts for about one-tenth of the total surface extent 7 of the diffusion region; that is, the covering ratio is about 0.1.

In a high-resolution printer, with a resolution of 1200 DPI or greater, the above dimensions must be reduced. If they are reduced proportionally, the area of the contact region 6a becomes too small, the contact resistance becomes too high for adequate current to flow, and insufficient light is emitted. If the same contact area is maintained when the other dimensions are reduced, however, then the covering ratio becomes so high that light emission is again insufficient.

The problem of creating a satisfactory LED array for a high-resolution printer is not simply a matter of determining how to scale down the covering ratio. Various other factors have to be considered, including the spacing between adjacent light-emitting regions, the spacing between the light-emitting regions at the ends of the array and the physical edges of the substrate, and the effect of these spacings on the quality of the printed output. The prior art has lacked a satisfactory solution that takes these factors into account.

SUMMARY OF THE INVENTION

It is accordingly an object of the present invention to provide a LED array with a resolution or at least one thousand two hundred dots per inch, combining low electrical resistance with adequate light emission.

Another object of the invention is to provide a print head that illuminates a photosensitive drum with high contrast and high uniformity at a resolution of at least one thousand two hundred dots per inch.

Yet another object is to provide an electrophotographic printer that prints with high contrast, and high uniformity at a resolution of at least one thousand two hundred dots per inch.

The invented LED array is an array of the type formed by diffusion of an impurity of one conductive type into a semiconductor substrate of an opposite conductive type, creating diffusion regions disposed below windows in an insulating film covering the surface of the semiconductor substrate, and having electrodes making individual electrical contact with the diffusion regions through the windows. Each diffusion region, window, and electrode constitute one LED. The LEDs are arranged in a linear array with an array pitch P in the direction of the array.

According to a first aspect of the invention, each diffusion region has a surface extent with a width $W_0$, parallel to the direction of the array, such that $$0.4P \leq W_0 \leq 0.5P.$$

According to a second aspect of the invention, each window has a width $W_1$, parallel to the direction of the array, such that $$0.3P \leq W_1 \leq 0.4P.$$

According to a third aspect of the invention, each diffusion region has a surface extent with an area of $S_0$, of which the electrode covers an area of $S_2$, and $$0.25S_0 \leq S_2 \leq 0.5S.$$

According to a fourth aspect of the invention, the distance $W_{10}$ from the edge of the substrate at one end of the array to the center of the LED disposed at that end of the array satisfies the condition $$0.25P \leq W_{10} \leq 0.65P.$$

The invented print head and electrophotographic printer employ LED arrays of the invented type.

BRIEF DESCRIPTION OF THE DRAWINGS

In the attached drawings:

FIG. 14 is a plan view of a LED array chip in a third embodiment of the invention;

DETAILED DESCRIPTION OF THE INVENTION

Embodiments of the invention will be described with reference to the attached exemplary drawings.

First Embodiment

Figure 1:
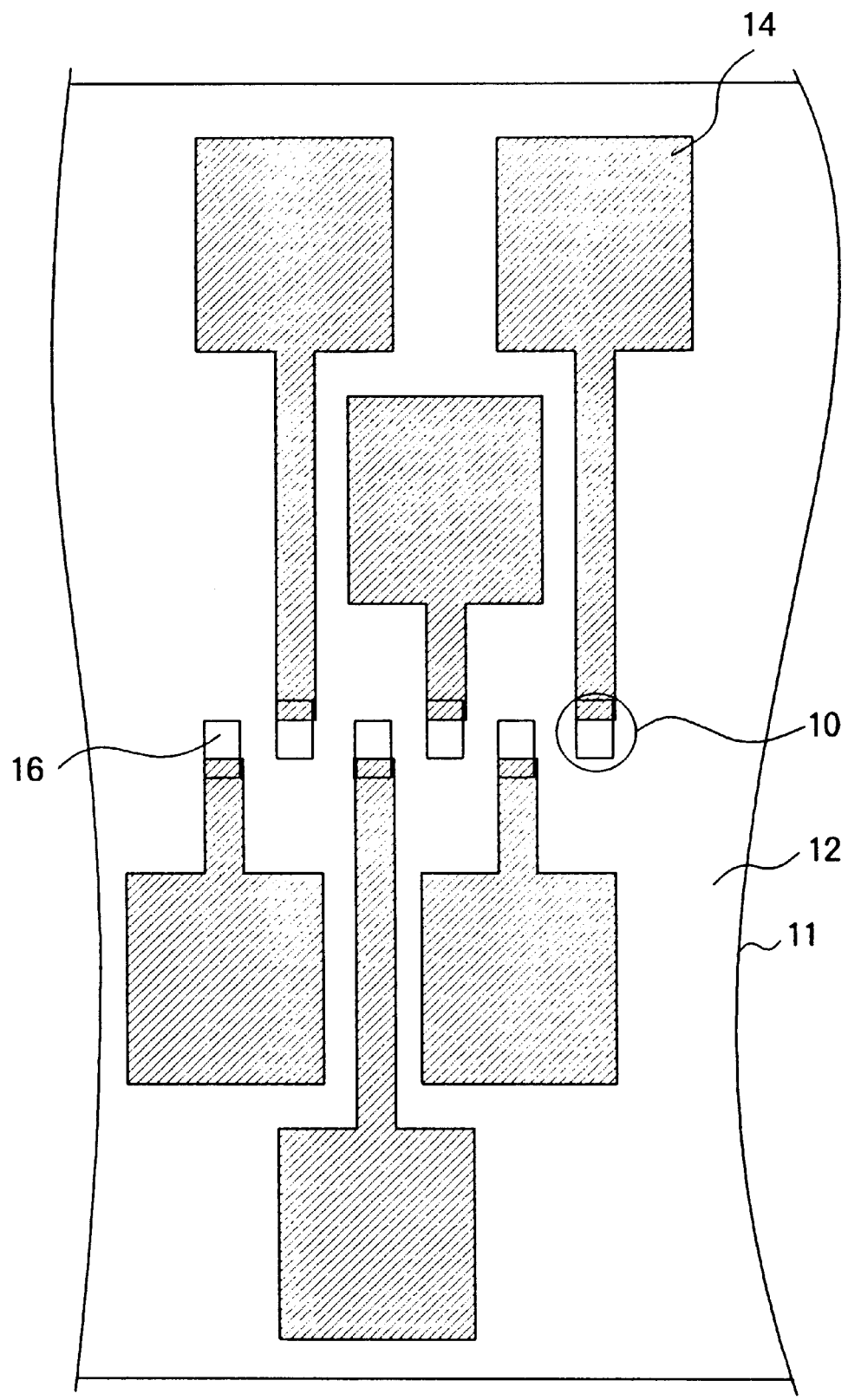
FIG. 1 is a plan view of part of a LED array illustrating a first embodiment of the invention.
Figure 2:
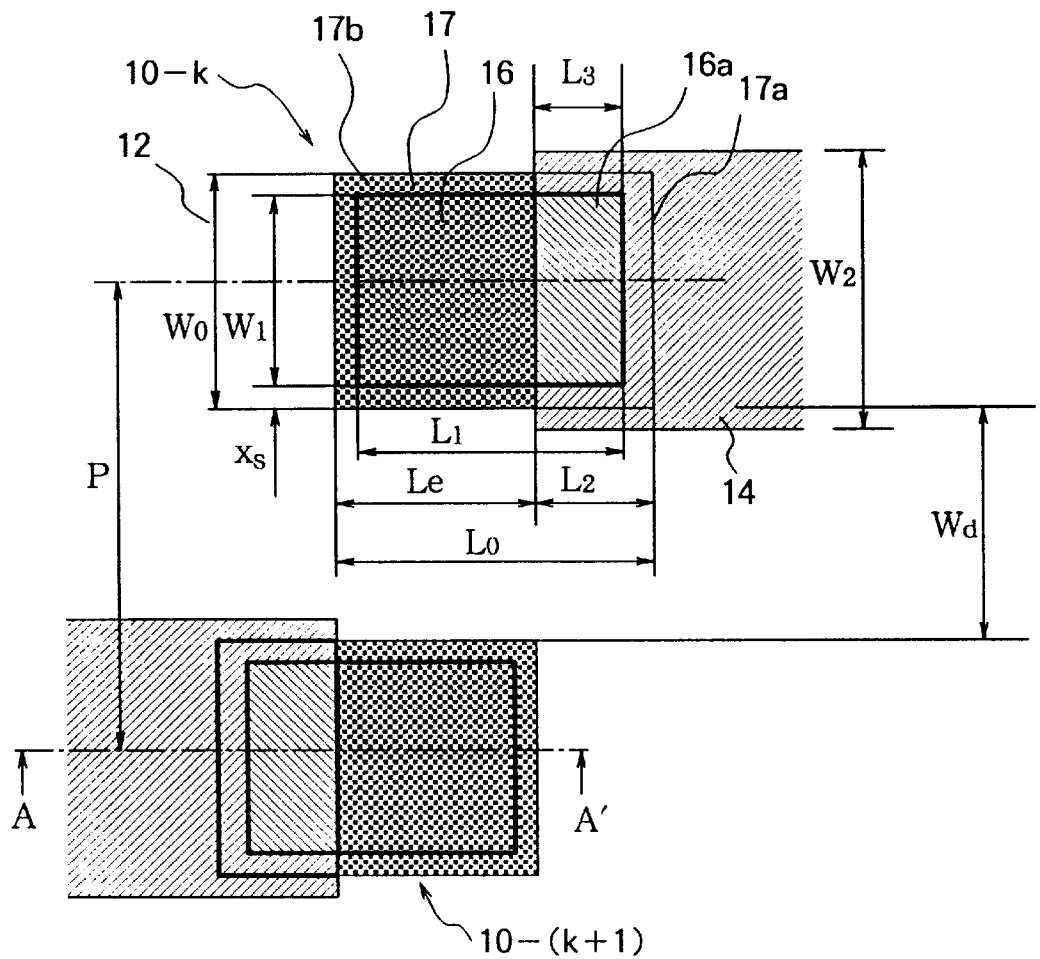
FIG. 2 is an enlarged plan view of two adjacent LEDs in FIG. 1.
Figure 3:
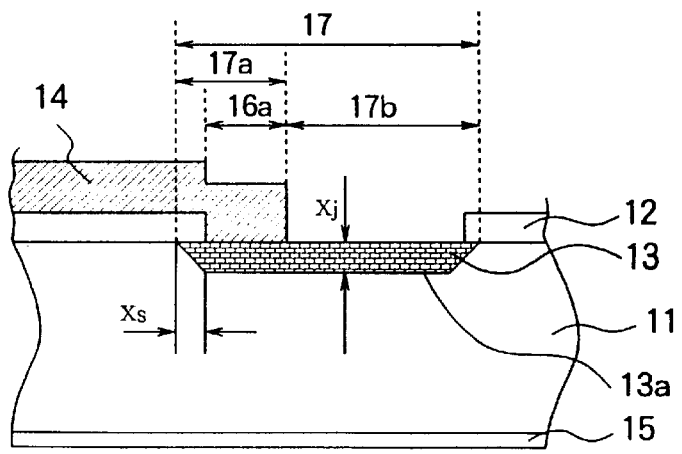
FIG. 3 is a sectional view through line A–A' in FIG. 2.

The first embodiment is a 1200-DPI LED array, shown in plan view in FIGS. 1 and 2 and in sectional view in FIG. 3.

Referring to FIG. 1, the LED array comprises a certain number of LEDs 10 formed in an n-type semiconductor substrate 11 covered by a transparent insulating film 12, with p-electrodes 14 leading from alternate sides of the array to windows 16 in the insulating film 12. When necessary, individual LEDs 10 will be identified as LEDs 10-1 to 10-N, where N is the number of LEDs in the array. FIG. 2 shows a pair of adjacent LEDs 10-k and 10-(k+1) (where 0<k<N). The array pitch P is substantially twenty-one micrometers (21 $\mu$m). The other dimensions shown in FIG. 2 will be described later. FIG. 3, which shows a sectional view through line A–A' in FIG. 2, indicates further dimensions that will be described later, and shows a p-type diffusion region 13, a pn junction 13a, and a common n-electrode 15.

As shown in FIGS. 2 and 3, the surface extent 17 of the p-type diffusion region 13 is divided into a covered extent 17a covered by the p-electrode 14, and an emitting extent 17b not covered by the p-electrode 14. Each LED 10 emits light from its emitting extent 17b. Although light is emitted from the pn junction below the entire surface extent 17, light emitted below the covered extent 17a is blocked by the p-electrode 14 and does not reach the outside.

The emitting extents 17b of the LEDs 10 are aligned in a straight row. Since the covered extents 17a are disposed alternately on one side and the other side of the emitting extents 17b, the surface extents 17 are not aligned in a straight row, but are slightly staggered. Similarly, the windows 16 are slightly staggered.

FIGS. 4A to 4E illustrate steps in the fabrication of this LED array, showing sectional views similar to FIG. 3, and using the same reference numerals.

Figure 4A:
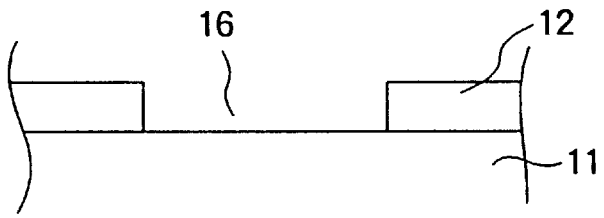
FIGS. 4A, 4B, 4C, 4D, and 4E illustrate steps in a fabrication process for the first embodiment.

FIG. 4A shows the step of patterning the insulating film 12 to form the windows 16. The semiconductor substrate 11 is, for example, a gallium-arsenide (GaAs) substrate with an epitaxial layer of gallium-arsenide-phosphide (GaAsP). The insulating film 12 is, for example, an aluminum nitride (AlN) film deposited to a thickness of substantially two thousand angstroms (2000 Å) by sputtering.

Figure 4B:
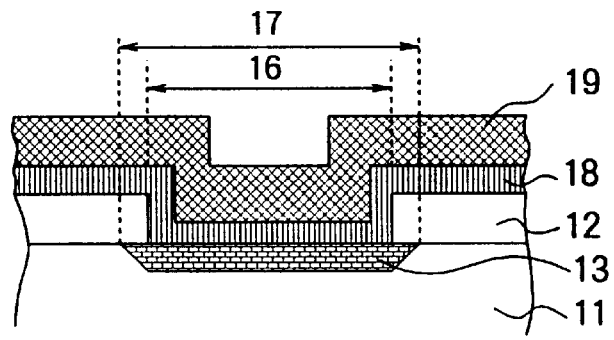

FIG. 4B shows a solid-phase diffusion step in which a zinc diffusion source film 18 and an annealing cap 19 are deposited. The zinc diffusion source film 18 comprises, for example, an equal mixture of zinc oxide (ZnO) and silicon dioxide ($SiO_2$), deposited to a thickness of substantially one thousand angstroms (1000 Å) by sputtering. The annealing cap 19 comprises, for example, silicon nitride (SiN), and is deposited to a similar thickness of substantially one thousand angstroms (1000 Å) by chemical vapor deposition (CVD). After the annealing cap 19 has been formed, high-temperature annealing is carried out, causing zinc to diffuse through each window 16 into the substrate 11, forming a p-type diffusion region 13. The annealing conditions are, for example, 700° C. for two hours. The annealing cap 19 prevents zinc from diffusing into the ambient atmosphere. Lateral diffusion widens the surface extent 17 of the p-type diffusion region 13 beyond the limits of the window 16.

Solid-phase diffusion can create shallow diffusions with a high surface concentration. Under the above conditions, the diffusion depth is substantially one micrometer (1 $\mu$m), and the concentration of zinc at the surface of the p-type diffusion region 13 is substantially $10^{20}$ carriers per cubic centimeter ($10^{20}$ $cm^{-3}$). LEDs with high light-emitting efficiency are formed, because the electrical resistance of the surface is low, and because light is emitted close to the surface.

Figure 4C:
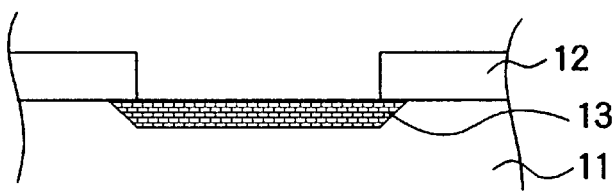

FIG. 4C shows the result of a wet etching step that selectively removes the zinc diffusion source film 18 and annealing cap 19. The etchant is, for example, buffered hydrofluoric acid (HF), which does not etch the insulating film 12.

Figure 4D:
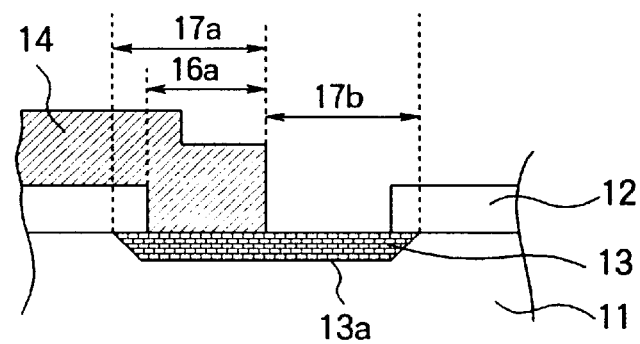

FIG. 4D shows the result of a photolithography step that forms the p-electrodes 14. A detailed description will be omitted, as photolithography is well known. The electrode material is a conductive material, such as aluminum (Al), capable of forming ohmic contacts with the p-type diffusion regions 13. The p-electrodes 14 are patterned so as to partly cover each window 16, creating a contact region 16a, and dividing the surface extent 17 of the p-type diffusion region 13 into a (covered extent 17a and an emitting extent 17b.

Figure 4E:
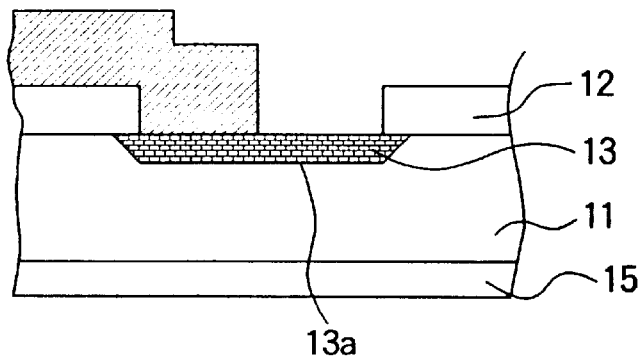

FIG. 4E shows the formation of the n-electrode 15. The n-electrode 15 is, for example, a gold alloy film. The underside of the substrate 11 is polished, then the n-electrode 15 is deposited by, for example, sputtering.

Next, the LED dimensions indicated in FIGS. 2 and 3 will be described. Width will refer to dimensions parallel to the array direction. Length will refer to dimensions perpendicular to the array direction. The array direction is the direction of the arrow marked P in FIG. 2. Width dimensions will be described first.

In FIG. 2, $W_0$ is the width of the surface extent 17 of the p-type diffusion region 13, $W_1$ is the width of the window 16, and $W_2$ is the width of the p-electrode 14. As $W_2$ is greater than $W_0$, $W_0$ is also the width of the covered extent 17a of the p- type diffusion region 13. As $W_2$ and $W_0$ are both greater than $W_1$, the width $W_1$ of the window 16 is also the width of the contact region 16a. The p-electrode 14 completely covers one side the surface extent 17 of the p-type diffusion region 13, parallel to the array direction. The p-type diffusion regions 13 of adjacent LEDs 10 are separated by a distance $W_d$.

The LED array in the first embodiment is intended for use in the print head of an electrophotographic printer having a photosensitive drum, a developing unit that applies toner to the photosensitive drum, and a transfer unit that transfers the toner from the photosensitive drum to a printing medium such as paper. The light emitted by the individual LEDs 10 is focused by a lens array onto the photosensitive drum. Drawings showing the photosensitive drum, developing unit, transfer unit, and lens array will be omitted, as these elements of an electrophotographic printer are well known.

The image formed on the photosensitive drum ideally has high uniformity in illuminated areas, with high contrast between illuminated areas and non-illuminated areas. While uniformity and contrast are affected to some degree by the optical properties of the lens array and the material properties of the photosensitive drum, they are more affected by the width $W_0$ of the surface extent 17 of the p-type diffusion regions 13, or by the ratio $W_0/P$ of this width to the array pitch P.

Figure 5A:
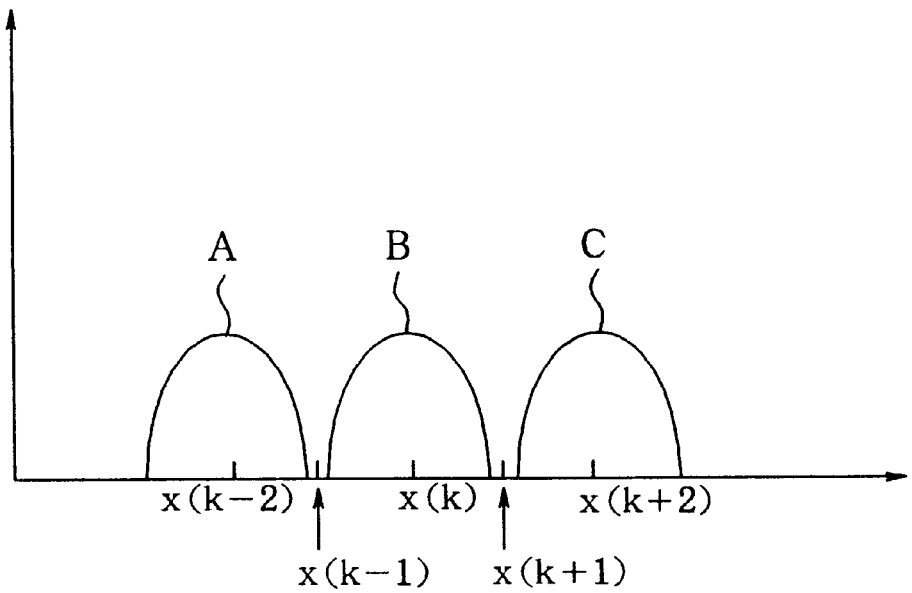
FIG. 5A illustrates the meaning of optical contrast and resolution in a LED array.

Referring to FIG. 5A, contrast is determined by measuring the contrast of the illumination pattern on the surface of the photosensitive drum when alternate LEDs 10 in the array are driven. The horizontal axis in FIG. 5A represents position in the array direction, x(k−2), x(k−1), x(k), x(k+1), and x(k+2) denoting the positions of five consecutive illuminated spots or dots on the drum surface. These five positions are the centers of the illuminated spots created by five LEDs 10-(k−2), 10-(k−1), 10-k, 10-(k+1), and 10-(k+2). The vertical axis represents optical intensity. LEDs 10-(k−2), 10-k, and 10-(k+2) produce illumination patterns A, B, and C, respectively.

If the width $W_0$ is narrow and the ratio $W_0/P$ is sufficiently small, the illumination at positions x(k−1) and x(k+1) is zero, and an ideal unity contrast ratio is obtained. As $W_0/P$ increases, however, illumination patterns A, B, and C begin to overlap, the illumination at positions x(k−1) and x(k+1) begins to increase, and the contrast ratio decreases accordingly. The contrast can be measured as the value of the modulation transfer function (MTF) at a spatial frequency corresponding to the combined illumination profile.

Figure 5B:
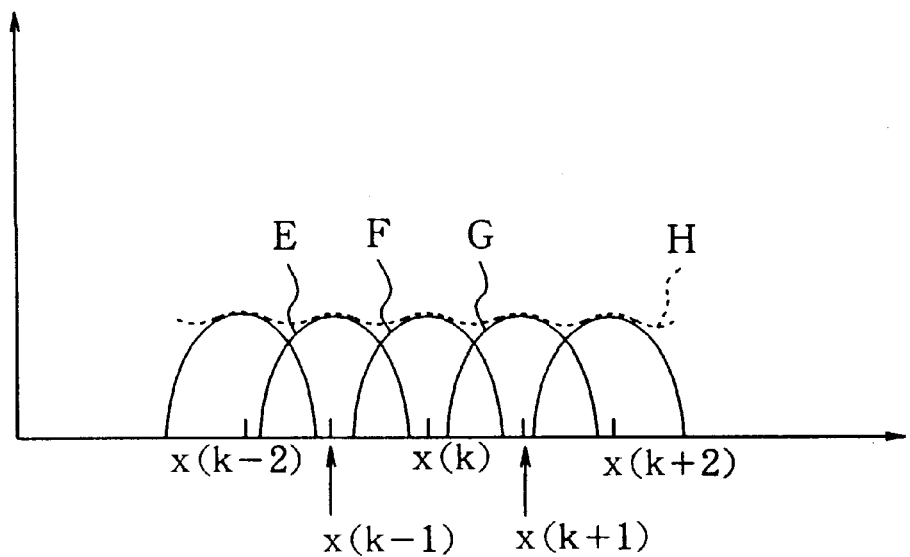
FIG. 5B illustrates the meaning of optical uniformity in a LED array.

Referring to FIG. 5B, uniformity is determined from the illumination pattern when all LEDs 10 are driven. The horizontal and vertical axes in FIG. 5B have the same meaning as in FIG. 5A. The illumination patterns E, F, and G of adjacent LEDs 10-(k−1), 10-k, and 10-(k+1) overlap considerably. The wider the individual illumination patterns E, F, and G are, the greater the overlap will become, and the more nearly uniform the combined illumination profile H will be. The larger the ratio $W_0/P$ is, accordingly, the more nearly uniform the printed result will be.

Figure 6:
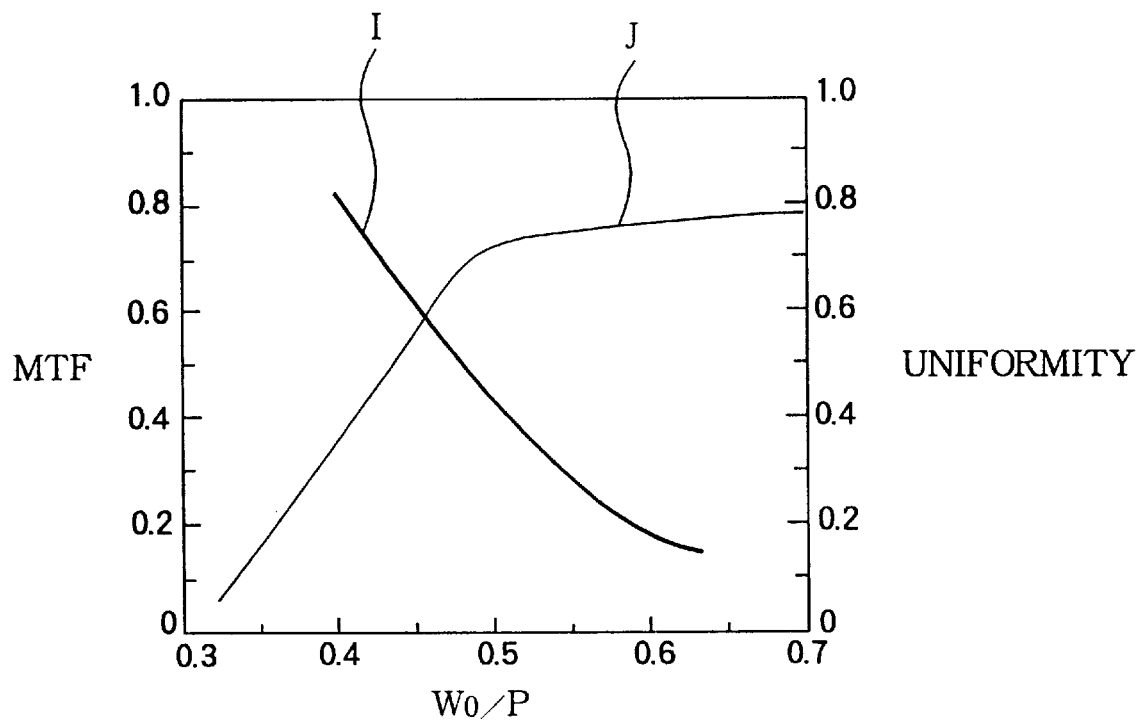
FIG. 6 illustrates relationships among uniformity, contrast or resolution, and LED width and pitch.

A comparatively small $W_0/P$ ratio is therefore desirable for contrast, while a large $W_0/P$ ratio is desirable for uniformity. These conflicting requirements are illustrated in FIG. 6, which shows the $W_0/P$ ratio on the horizontal axis, the MTF value on the left vertical axis, and the uniformity value on the right vertical axis. The MTF and uniformity values are both normalized to a scale from zero to one. Curve I indicates the MTF value, while curve J indicates uniformity. The shape of these curves I and J varies somewhat depending on the value of P and the optical properties of the lenses used in the print head, but these variations do not alter the general trend that as $W_0/P$ increases, uniformity (J) increases, while the MTF value or contrast (I) decreases.

The inventors have performed experiments to determine how the MTF and uniformity values affect the perceived quality of the printed output of an electrophotographic printer. At low MTF values, resolution is lost and the printed output does not appear sharp, but the experimental results show that it the MTF value is at least 0.4, the loss of sharpness is difficult to discern. From FIG. 6, to obtain an MTF value of at least 0.4, the $W_0/P$ ratio should be 0.5 or less. At low uniformity values, printing irregularities become visible, but the experimental results show that if the uniformity value is at least 0.4, these irregularities are difficult to discern. From FIG. 6, uniformity values of at least 0.4 are obtained when $W_0/P$ is at least 0.4.

Although the quality of the printed output is also affected by the material properties of the photosensitive drum, and of the toner used to develop the image on the drum, the experimental results indicate that the conflicting requirements of contrast and uniformity can both be satisfied if $W_0/P$) is in the range between 0.4 and 0.5. The necessary condition is accordingly the following:

$$0.4P \leq W_0 \leq 0.5P \quad (1)$$

In the present embodiment, in which the array pitch P is substantially twenty-one micrometers 21 μm, this condition is satisfied by setting $W_0$ equal to ten micrometers (10 μm, or about 4.7P. The space $W_d$ between adjacent LEDs is then eleven micrometers (11 μm), a value that provides adequate electrical isolation between adjacent LEDs.

The width $W_1$ of the window 16 can be expressed as follows in terms of the dimension $W_0$ and the lateral diffusion distance $x_s$.

$$W_1 = W_0 - 2x_s \quad (2)$$

Referring again to FIG. 3, the lateral diffusion distance $x_s$ is substantially equal to the junction depth or diffusion depth $x_j$. As mentioned in the description of the fabrication process, the diffusion depth $x_j$ is substantially one micrometer (1 μm), so $W_1$ is substantially equal to eight micrometers (8 μm).

The condition to be satisfied by the width $W_1$ of the window 16 can be stated as follows in terms of the array pitch P and lateral diffusion distance $x_s$.

$$0.4P - 2x_s \leq W_1 \leq 0.5P - 2x_s \quad (3)$$

For an array pitch P of twenty-one micrometers (21 μm) and lateral diffusion distance $x_s$ of one micrometer (1 μm), since $2x_s$ (2 μm) is substantially equal to 0.1P, the condition to be satisfied by $W_1$ can be restated as follows.

$$0.3P \leq W_1 \leq 0.4P \quad (4)$$

The width $W_2$ of the p-electrodes 14 is not stringently constrained, but should exceed the value or $W_0$ by an amount sufficient to allow for alignment errors in the photolithography process.

Next, lengths and areas will be described. $L_0$ and $S_0$ denote the length and area, respectively, of the surface extent 17 of the p-type diffusion region 13. $L_1$ and $S_1$ denote the length and area of the window 16, $L_2$ and $S_2$ denote the length and area of the covered extent 17a, $L_3$ and $S_3$ denote the length and area of the contact region 16a, and $L_e$ and $S_e$ denote the length and area of the emitting extent 17b. $S_1$, $S_2$, $S_3$, and $S_e$ will be referred to below as the window area, covered area, contact area, and emitting area, respectively.

The LEDs 10 in an electrophotographic printer are generally driven at a constant voltage. if the area $S_0$ of the surface extent 17 is considered to be fixed, then the amount of light generated internally in a LED 10 depends on the photoelectric conversion efficiency, which depends on the contact resistance between the p-electrode 14 and the p-type diffusion region 13, which depends in turn on the contact area $S_3$. Of the light generated internally, the proportion emitted to the outside depends on the covering ratio $S_2/S_0$.

Figure 7:
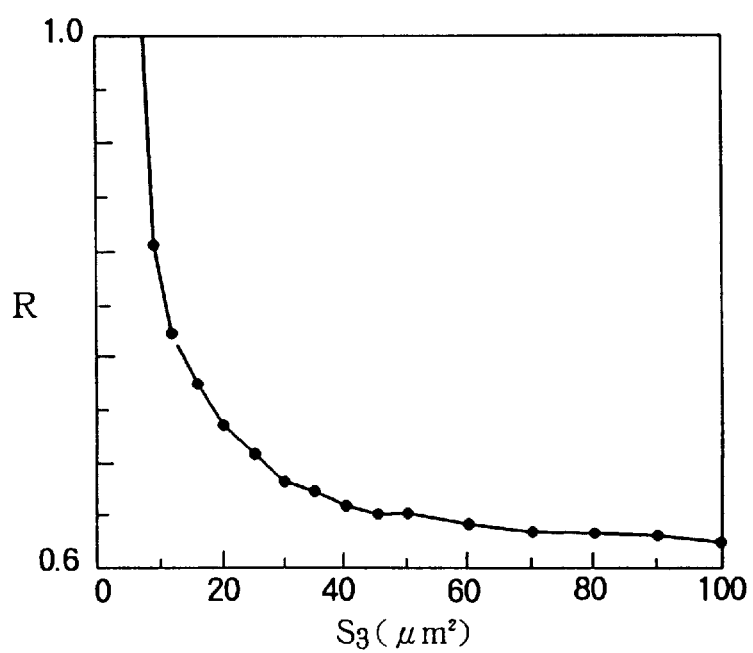
FIG. 7 illustrates a relationship between contact area and contact resistance.

FIG. 7 illustrates the relationship between the contact area $S_3$ and contact resistance R, showing the contact area $S_3$ in square micrometers on the horizontal axis, and the contact resistance R on a normalized scale on the vertical axis. The contact area $S_3$ and contact resistance R are inversely proportional.

Figure 8:
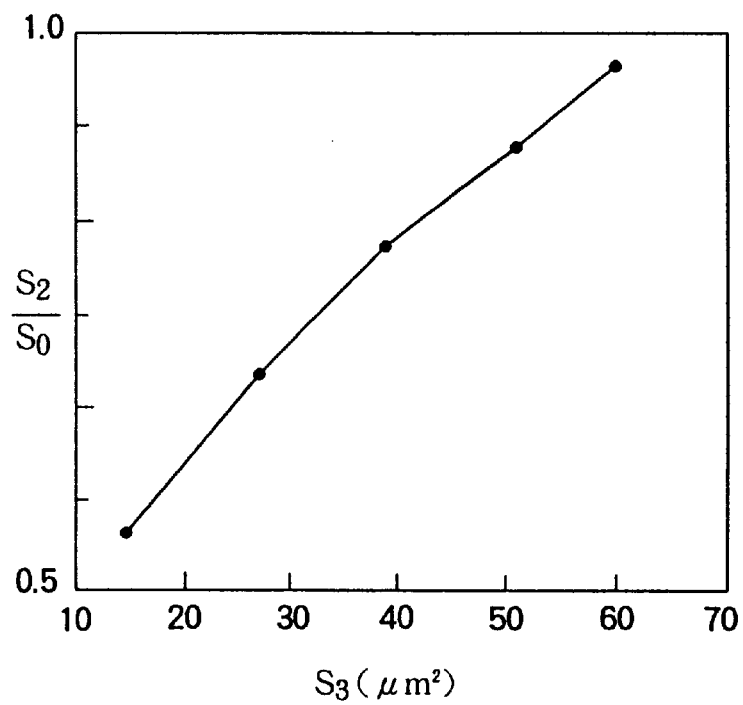
FIG. 8 illustrates a relationship between contact area and covering ratio.

FIG. 8 illustrates the relationship between the contact area $S_3$ and the covering ratio $S_2/S_0$, assuming that the area $S_0$ of the surface extent 17 is fixed. The contact area $S_3$ is shown on the horizontal axis, and the covering ratio $S_2/S_0$ on the vertical axis. The relationship is substantially linear.

Figure 9:
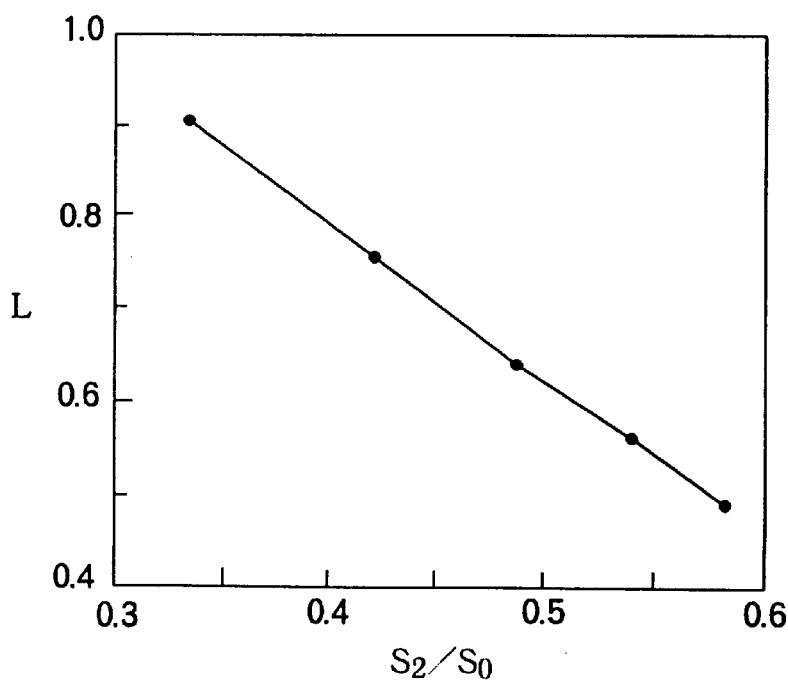
FIG. 9 illustrates a relationship between covering ratio and light emission.

FIG. 9 illustrates the relationship between the covering ratio $S_2/S_0$ and the proportion or ratio L of internally generated light that is emitted from the LED, showing the covering ratio $S_2/S_0$ on the horizontal axis and the light emission ratio L on the vertical axis. This relationship is also linear, the light emission ratio L decreasing as the covering ratio $S_2/S_0$ increases.

Figure 10:
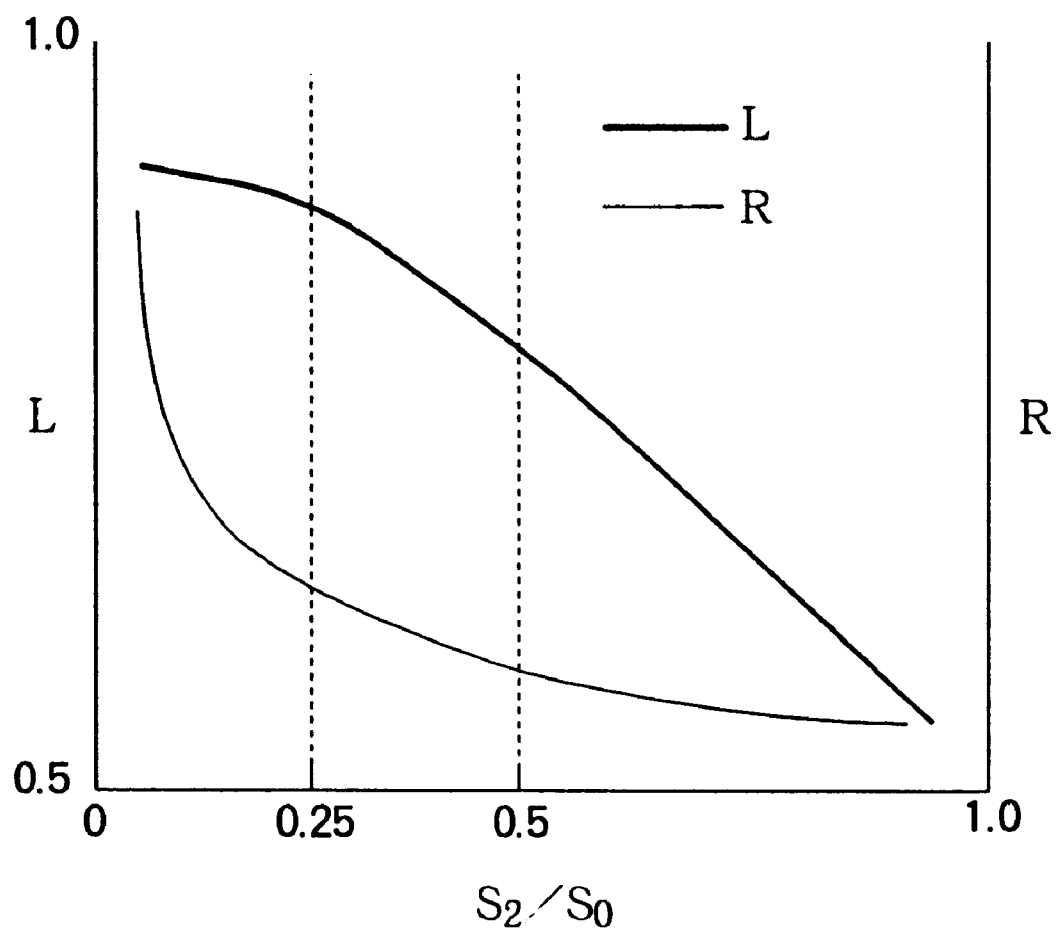
FIG. 10 illustrates relationships among covering ratio, light emission, and contact resistance.

FIG. 10 illustrates the relationship of the covering ratio $S_2/S_0$, shown on the horizontal axis, to the light emission ratio L, shown on the left vertical axis, and the contact resistance R, shown on the right vertical axis. The area $S_0$ of the surface extent, 17 is again assumed to be fixed. The scales on both vertical axes are normalized. The thick curve indicates the light emission ratio L. The thin curve indicates the contact resistance R.

FIG. 10 shows that as the covering ratio $S_2/S_0$ increases, the contact resistance R decreases, so more light is generated within the LED but less of this light is emitted to the outside. When the covering ratio $S_2/S_0$ is less than 0.25, the steep rise in the contact resistance R overwhelms the relatively slight gain in the light emission ratio L. When the covering ratio $S_2/S_0$ increases beyond 0.5, the relatively small reduction in contact resistance R fails to compensate for the reduction in the light emission ratio L. In the range of covering ratios $S_2/S_0$ from 0.25 to 0.5, the two opposing factors L and R roughly offset each other. Moreover, the change in light emission in this range is from approximately 0.9 (on a normalized scale) at a covering ratio of 0.25 to approximately 0.8 at a covering ratio of 0.5. This variation of approximately ten percent (10%) is small enough to be compensated for by varying the driving conditions. The conclusion drawn from FIG. 10 is that the covering ratio $S_2/S_0$ should be from 0.25 to 0.5, which can be stated as follows.

$$0.25S_0 \leq S_2 \leq 0.5S_0 \quad (5)$$

This equation can be used in determining $S_0$ and $S_2$ after the area $S_e$ of the emitting extent 17b has been determined, as below.

The length $L_e$ of the emitting extent 17b in the present example is ten micrometers (10 µm), equal to the width $W_0$ of the surface extent 17, so that the emitting extent 17b has a square shape and produces a substantially circular spot of light on the photosensitive drum. The emitting area $S_e$ is accordingly one hundred square micrometers (100 µm$^2$). If the length $L_2$ of the covered extent 17a is five micrometers (5 µm), for example, then the length $L_0$ of the surface extent 17 is fifteen micrometers (15 µm), the covered area $S_2$ is fifty square micrometers (50 µm$^2$), and the area $S_0$ of the surface extent 17 is one hundred fifty square micrometers (150 µm). These dimensions satisfy the condition given above, since $S_2$ is equal to $0.33S_0$.

Since the lateral diffusion distance $x_s$ is substantially one micrometer (1 µm), the length $L_1$ of the window 16 is thirteen micrometers (13 µm), and the window area $S_1$ is one hundred four square micrometers (8×13=104 µm$^2$). The length $L_3$ of the contact region 16a is four micrometers (4 µm), so the contact area $S_3$ is thirty-two square micrometers (8×4=32 µm$^2$).

For a given covered area $S_2$, it is advantageous for the contact area $S_3$ to be as large as possible, to reduce the contact resistance as much as possible. In the present example, the covered area $S_2$ is fifty square micrometers (50 µm$^2$) and the contact area $S_3$ is thirty-two square micrometers (32 µm$^2$), equal to $0.64S_2$. If a margin of about 0.2 is allowed, the following condition can be set on the contact area $S_3$ in relation to the covered area $S_2$:

$$S_3 \geq 0.4S_2 \quad (6)$$

Allowing generally similar margins for the contact area $S_3$ in relation to the window area $S_1$ and to the area $S_0$ of the surface extent 17 gives the following additional conditions:

$$S_3 \geq 0.1S_0 \quad (7)$$

$$S_3 \geq 0.2S_1 \quad (8)$$

The LED dimensions should be determined so that the area $S_0$ of the surface extent 17, the window area $S_1$, the covered area $S_2$, and the contact area $S_3$ satisfy relations (5) and (6), relations (5) and (7), or relations (5) and (8).

These conditions have been derived using the diffusion depth $x_j$ of one micrometer (1 µm) obtained by solid-phase diffusion of zinc, because a diffusion depth $x_j$ of one micrometer allows both the surface resistance and the absorption of light to be satisfactorily low. If the diffusion is much shallower, the surface resistance becomes too high, while if the diffusion is much deeper, too much of the light generated at the pn junction is absorbed before it can be emitted.

A high-density LED array combining high contrast (MTF) with high uniformity can accordingly be produced if the array pitch P and the width $W_0$ of the surface extent 17 satisfy condition (1), or if the array pitch P and the width $W_1$ of the windows 16 satisfy condition (4). If in addition the area $S_0$ of the surface extent 17 and the covered area $S_2$ satisfy condition (5), and if the contact area $S_3$ satisfies condition (6) in relation to the covered area $S_2$, condition (7) in relation to the area $S_0$ of the surface extent 17, or condition (8) in relation to the window area $S_1$, then the contact area $S_3$ will be large enough to provide a low contact resistance, and the covering ratio will be small enough for adequate light to be emitted.

The fabrication process of the LED array in the first embodiment is not limited to the process shown in FIGS. 4A to 4E, and the materials of the insulating film 12 and p-electrodes 14 are not limited to the materials described in that process. The shapes of the p-electrodes 14 are not limited to the shapes shown in FIGS. 1 to 3, provided condition (5) and one of conditions (6), (7), and (8) are satisfied.

Second Embodiment

Figure 11:
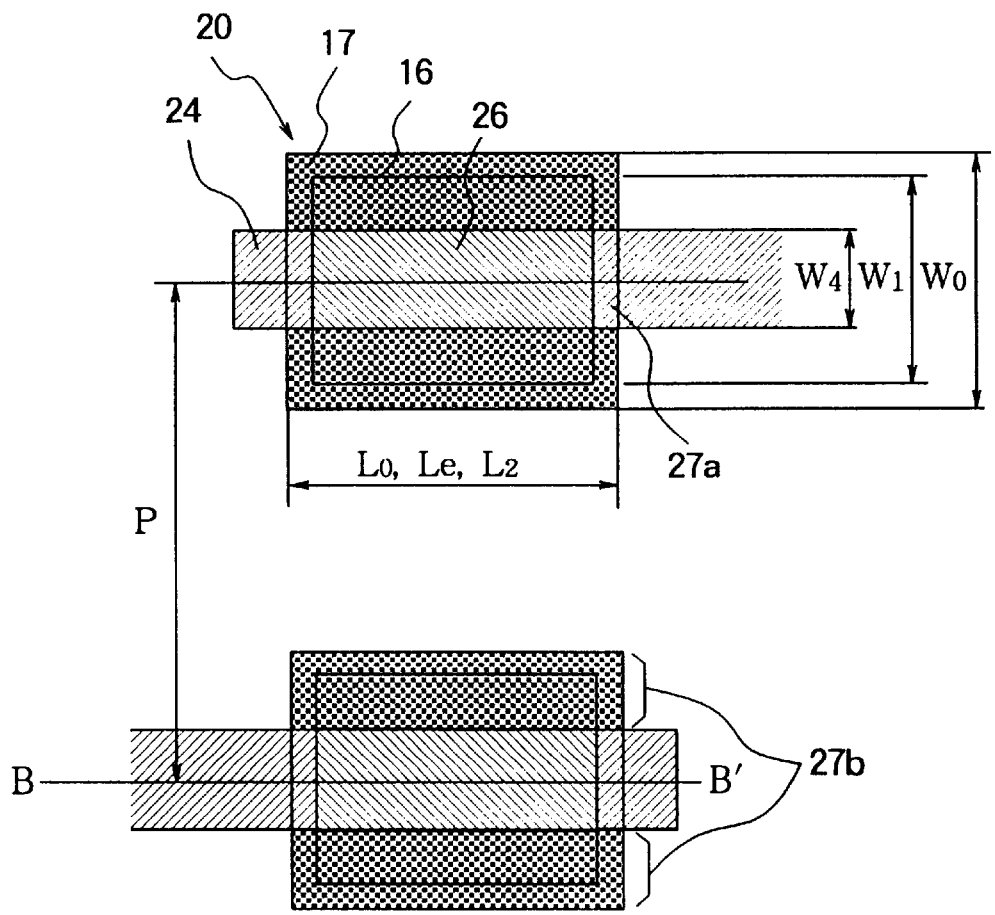
FIG. 11 is a plan view of two adjacent LEDs in a second embodiment of the invention.
Figure 12:
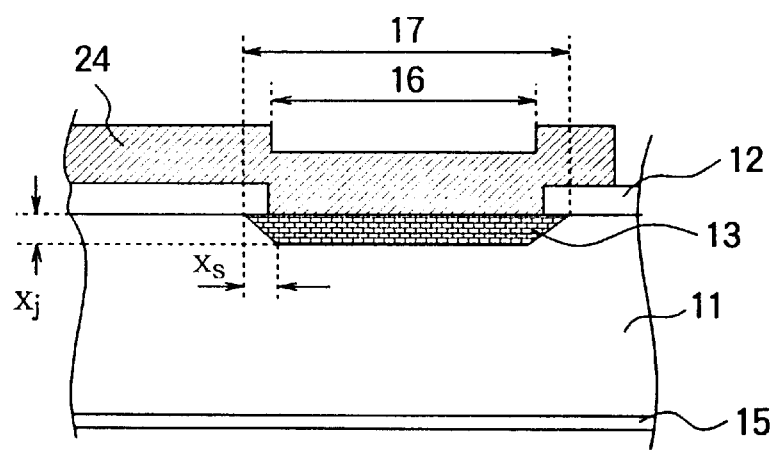
FIG. 12 is a sectional view through line B–B' in FIG. 11.

FIGS. 11 and 12 illustrate a 1200-DPI LED array according to a second embodiment of the invention. FIG. 11 is a plan view of two adjacent LEDs 20 in the array. FIG. 12 is a sectional view through line B-B' in FIG. 11.

The same reference numerals as in the first embodiment are used to indicate the n-type semiconductor substrate 11, the insulating film 12, the p-type diffusion region 13, the n-electrode 15, the windows 16, and the surface extent 17 of the p-type diffusion region 13. These elements are the same as in the first embodiment, except that the windows 16 and surface extents 17 are aligned in a straight row in the array direction, instead of being staggered as in the first embodiment. The p-electrodes 24 are made of the same material as the p-electrodes in the first embodiment, but differ in configuration.

The second embodiment can be fabricated by the same process as used to fabricate the first embodiment, substantially as shown in FIGS. 4A to 4F.

Dimensions $W_0$ and $W_1$ in FIG. 11 denote the width of the surface extent 17 and the width of the window 16, and are equal to the corresponding dimensions in the first embodiment ($W_0$=10 μm, $W_1$=8 μm). The width $W_4$ of the p-electrodes 24 is less than $W_1$. The p-electrodes 24 extend through the centers of the surface extents 17, from one side to a point beyond the opposite side. The area in which the p-electrode 24 overlaps the window 16 is the contact region 26. The area of overlap between the p-electrode 24 and surface extent 17 is the covered extent 27a. The emitting extent 27b is disposed on both sides of the covered extent 27a. The lengths $L_0$ of the surface extent 17, $L_2$ of the covered extent 27a, and $L_e$ or the emitting extent 27b are all equal to fifteen micrometers (15 μm). This common dimension ($L_0$=$L_2$=$L_e$) is limited by dot resolution requirements in the direction perpendicular to the array direction.

The width $W_4$ of the p-electrode 24 is, for example, four micrometers (4 μm). The area $S_2$ of the covered extent 27a is accordingly sixty square micrometers (60 μm²) Since the area $S_0$ of the surface extent 17 is one hundred fifty square micrometers (150 μm²), the covered area $S_2$ is equal to 0.4$S_0$, satisfying condition (5). The area $S_e$ of the emitting extent 27b is ninety square micrometers (90 μm²).

The length of the contact region 26 is thirteen micrometers (13 μm) so the area $S_3$ of the contact region 26 is fifty-two square micrometers (52 μm²). The contact area $S_3$ is substantially equal to 0.9$S_2$, 0.3$S_0$, and 0.5$S_1$, satisfying all three conditions (6), (7), and (8).

The contact area $S_3$ is considerably larger than in the first embodiment. This is in part due to the altered contact geometry, the ratio $S_3/S_2$ of the contact area to the covered area being higher than in the first embodiment. For a given covered area $S_2$, the second embodiment has the advantage of permitting a larger contact area $S_3$, hence a lower contact resistance.

Figure 13A:
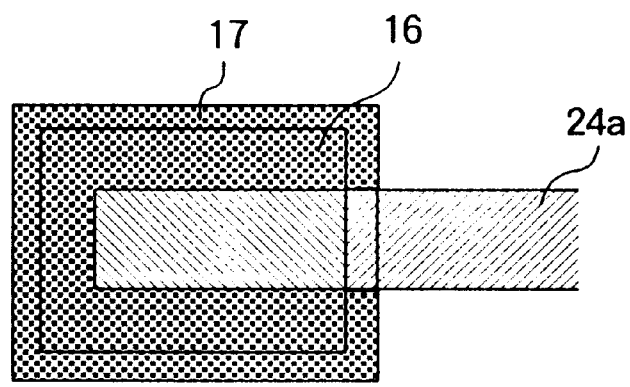
FIGS. 13A, 13B, and 13C illustrate variations in the electrode geometry in the second embodiment.
Figure 13B:
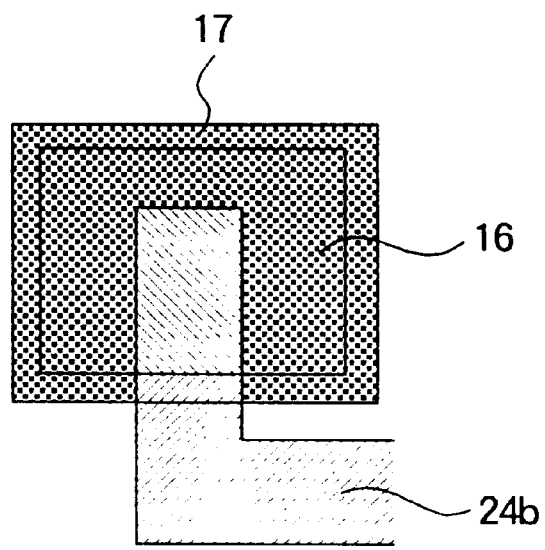
Figure 13C:
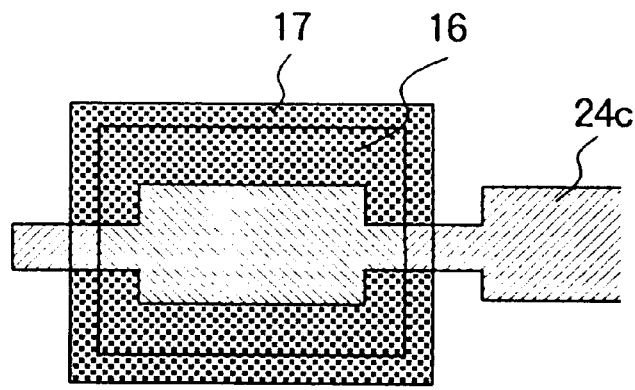

FIGS. 13A, 13B, and 13C illustrate variations in the contact geometry that can further increase the ratio $S_3/S_2$. The p-electrode 24a in FIG. 13A reaches into the surface extent 17 from a side parallel to the array direction, but does not extend to the opposite side. The p-electrode 24b in FIG. 13B is similar, but reaches into the surface extent 17 from a side perpendicular to the array direction. The p-electrode 24c in FIG. 13C reaches across the surface extent 17 from one side to the opposite side, but is narrowed at points that overlap the surface extent 17 without overlapping the window 16.

Third Embodiment

Figure 15:
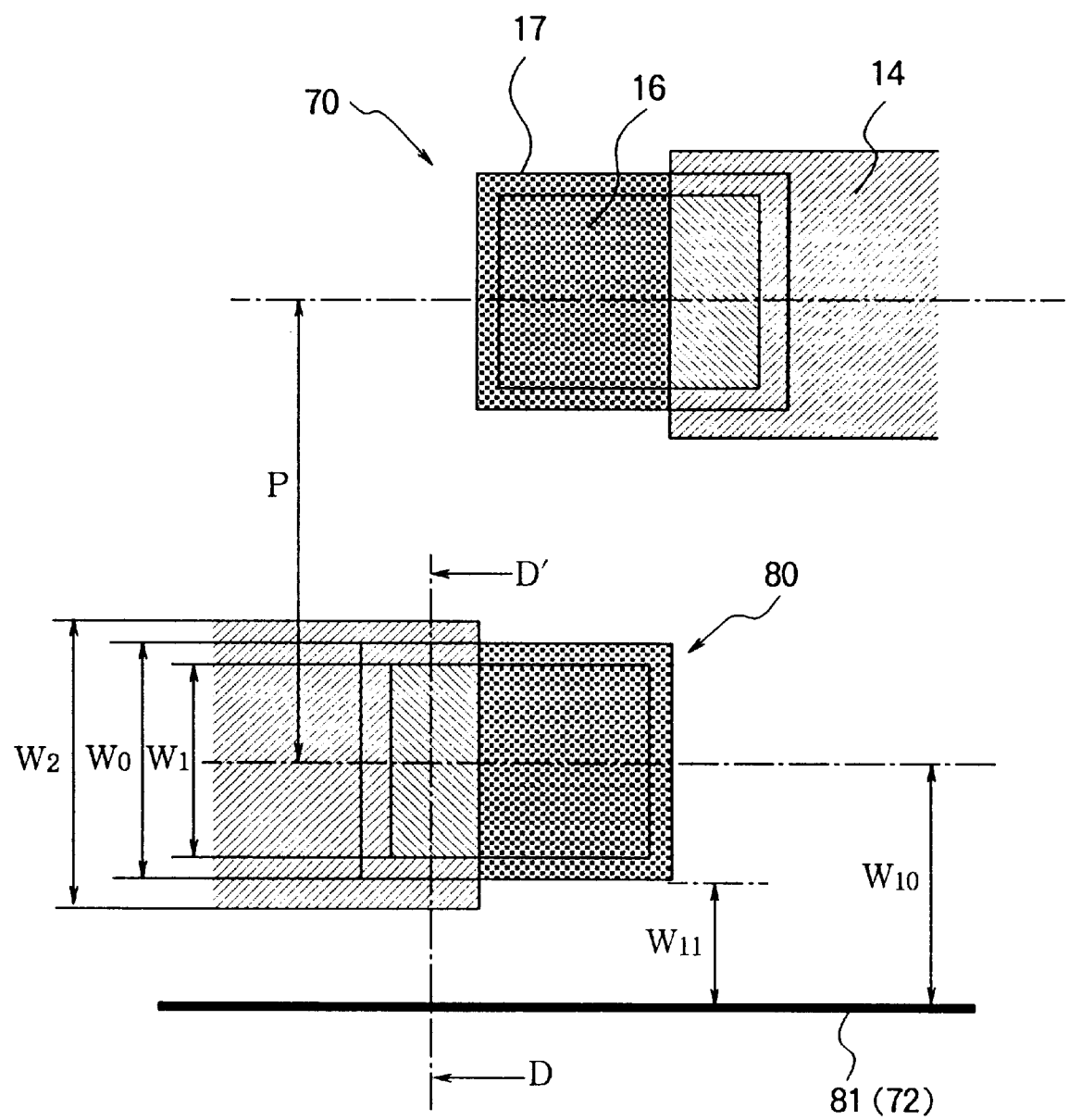
FIG. 15 is an enlarged plan view of two adjacent LEDs at one end of the array in the third embodiment.
Figure 16:
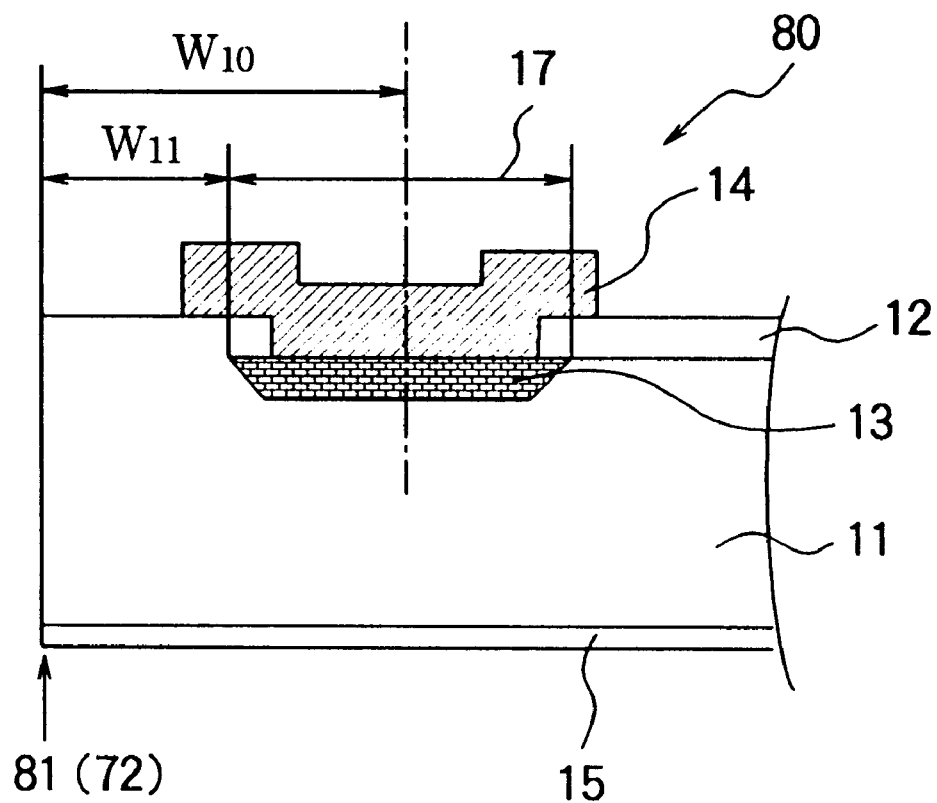
FIG. 16 is a sectional view through line D–D' in FIG. 15.

FIGS. 14 to 16 illustrate a 1200-DPI LED array according to a third embodiment of the invention. FIG. 14 is a plan view showing three sections of the array of LEDs 70-1 to 70-N. FIG. 15 is an enlarged plan view of two LEDs 70 and 80 at one end of the array. FIG. 16f is a sectional view through line D–D' in FIG. 15. Reference numerals that also appeared in FIGS. 1 to 3 identify corresponding elements.

LED 80 in FIG. 15 corresponds to either of the LEDs 80a and 80b disposed at the two ends of the array in FIG. 14. LEDs 80a and 80b are also identified by their array positions as LEDs 70-1 and 70-N.

When the fabrication process illustrated in FIGS. 4A to 4E is used to fabricate a LED array, it is customary to fabricate a plurality of LED arrays (one thousand arrays, for example) on a single n-type semiconductor wafer, then separate the individual arrays by, for example, a dicing process, using a dicing saw. After separation, each individual LED array is referred to as a die or chip. The term LED array chip will be used below to describe one of these chips, comprising a plurality of LEDs sharing a common substrate 11 and a common n-electrode 15.

FIG. 14 shows one LED array chip 7, comprising LEDs 70-1 to 70-N. The LED array chip 7 has long sides 71 parallel to the array direction, and short sides 72 perpendicular to this direction. Reference numerals 81a and 81b denote the physical edges of the substrate on the short sides 72, at opposite ends of the array of LEDs. Reference numeral 81 in FIGS. 15 and 16 denotes either one of these edges 81a and 81b. The number of LEDs on one LED array chip is, for example, two hundred fifty-six (N=256). Since the array pitch is twenty-one micrometers (P=21 μm), the length of the LED array chip 7 is approximately five millimeters (5 mm, substantially equal to 256×21 μm).

The LED structure shown in FIGS. 15 and 16 is the same as in the first embodiment. The LEDs 80 at the two ends of the LED array chip have the same structure as the other LEDs 70 in the array. The width $W_0$ of the surface extents 17 and the width $W_1$ of the windows 16 are the same as in the first embodiment. Two other dimensions are indicated in FIGS. 15 and 16: the distance $W_{10}$ from the edge 81 of the LED array chip to the center of the adjacent LED 80, and the distance $W_{11}$ from the edge 81 of the LED array chip to the adjacent edge of the surface extent 17 of this LED 80.

Figure 17A:
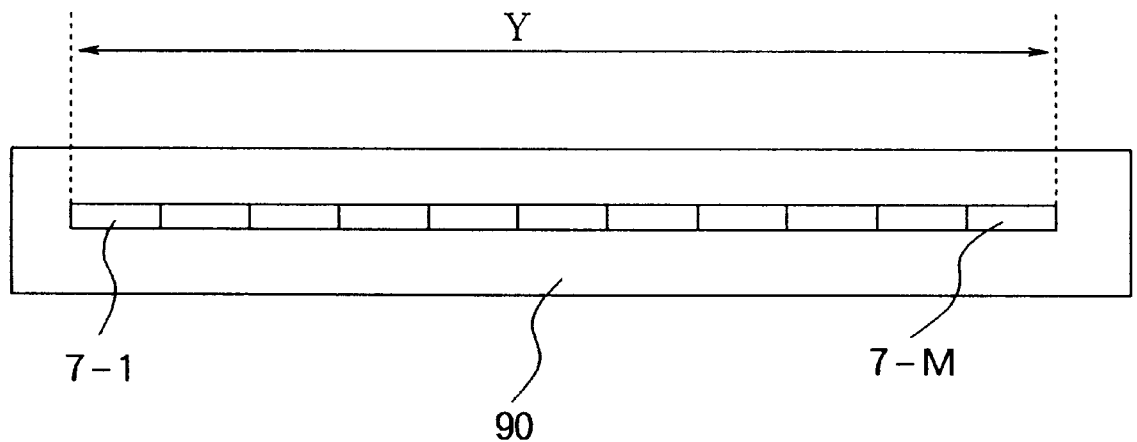
FIG. 17A is a plan view of a plurality of LED array chips mounted on a printed circuit board in a print head.

FIG. 17A shows a plurality of LED array chips 7-1 to 7-M mounted on a printed circuit board 90 in the print head of an electrophotographic printer, omitting the integrated (circuits that are mounted on the printed circuit board 90 to drive the LED array chips 7-1 to 7-M. For a printer using paper with the A4 width of two hundred ten millimeters (210 mm), about forty LED array chips (M=40) must be placed end-to-end to form a single array with a width Y substantially equal to the width of the paper.

Figure 17B:
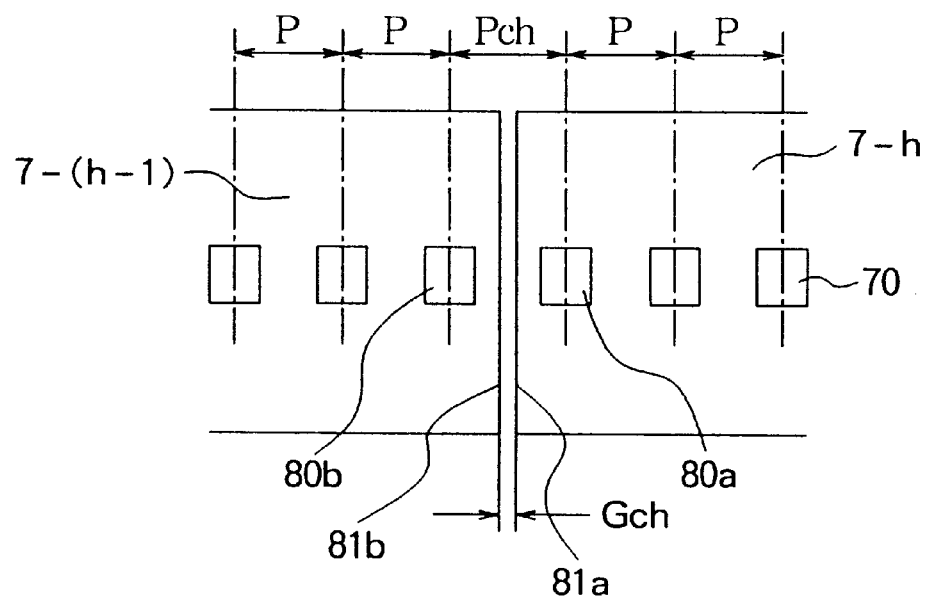
FIG. 17B is an enlarged plan view showing parts of two adjacent LED array chips in FIG. 17A.

FIG. 17B shows an enlarged view of the adjacent ends of two of these LED array chips 7-(h−1) and 7-h, where h is an arbitrary integer from two to M. A gap Gch is left between the edge 81b of LED array chip 7-(h−1) and the adjacent edge 81a of LED array chip 7-h, to protect the ends of the LED array chips from damage that might result from mutual contact. If mutual contact were permitted, mechanical shock or friction during the print-head assembly process, for example, might damage the LEDs 80a and 80b at the ends of the LED array chips, yielding a defective print head.

Figure 18A:
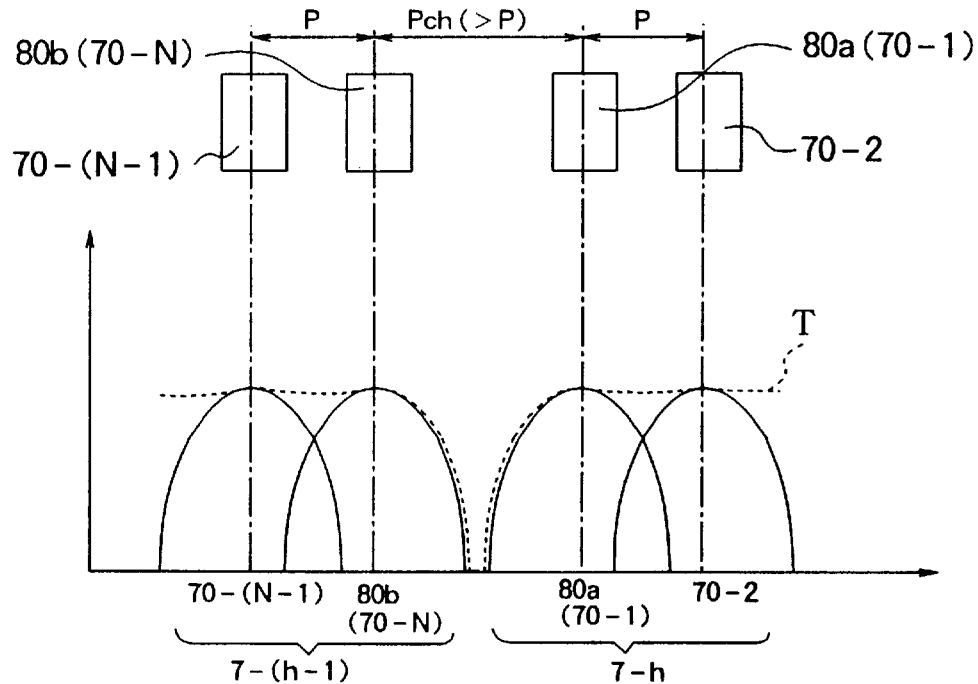
FIG. 18A illustrates a problem caused by too much space between LEDs on different LED array chips.
Figure 18B:
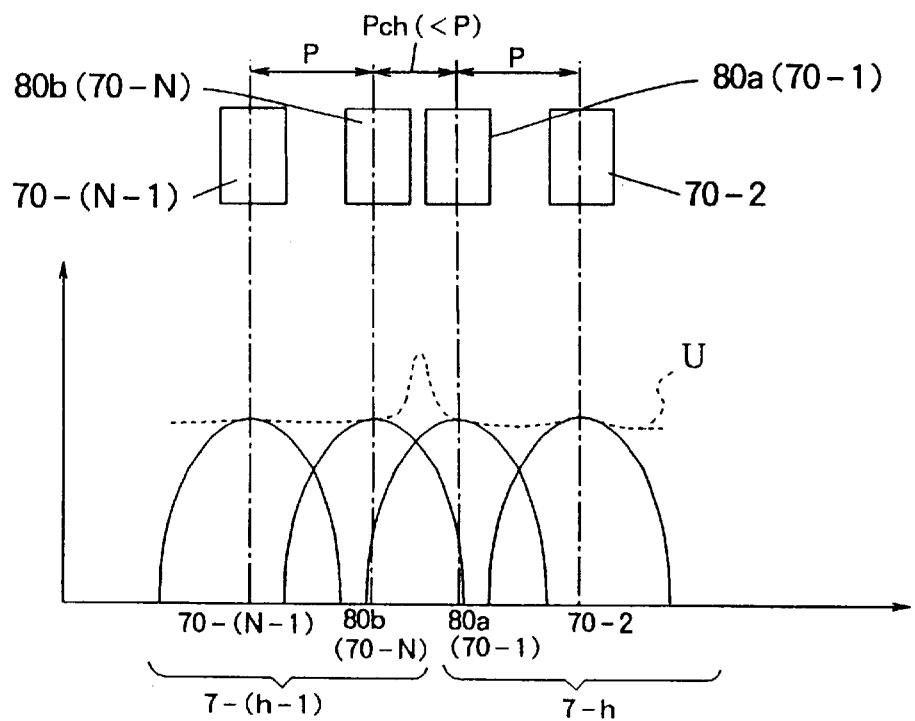
FIG. 18B illustrates a problem caused by too little space between LEDs on different LED array chips.
Figure 19:
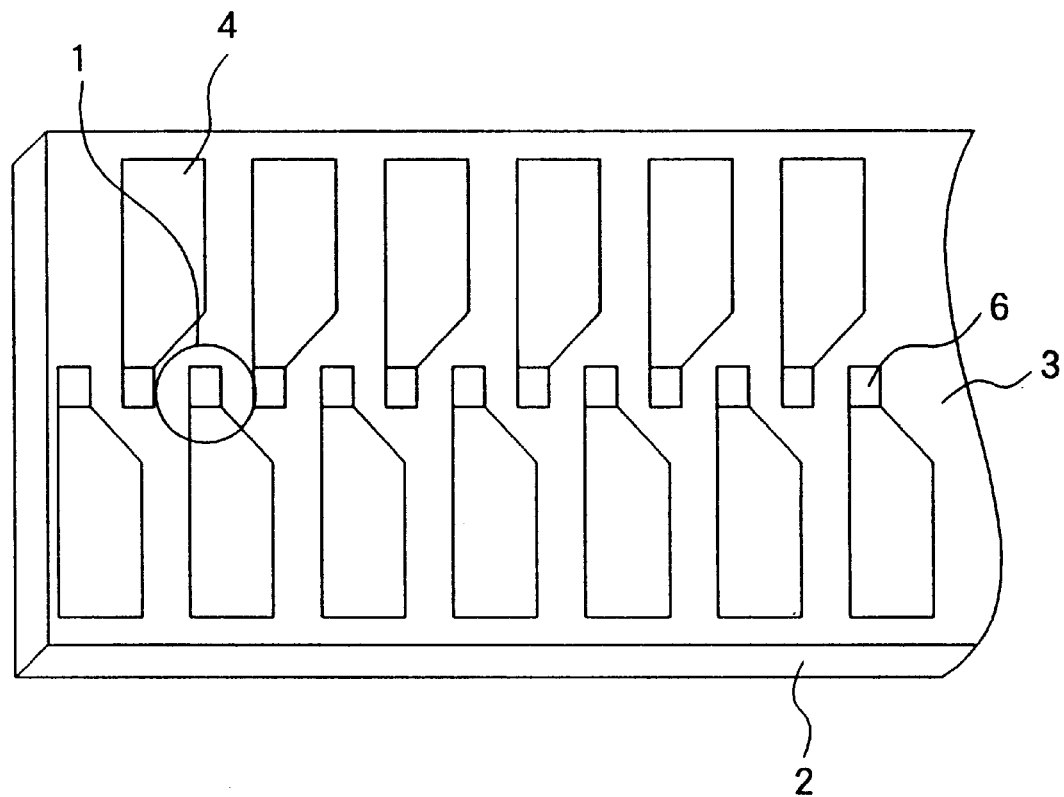
FIG. 19 is an oblique view of a conventional LED array.
Figure 20:
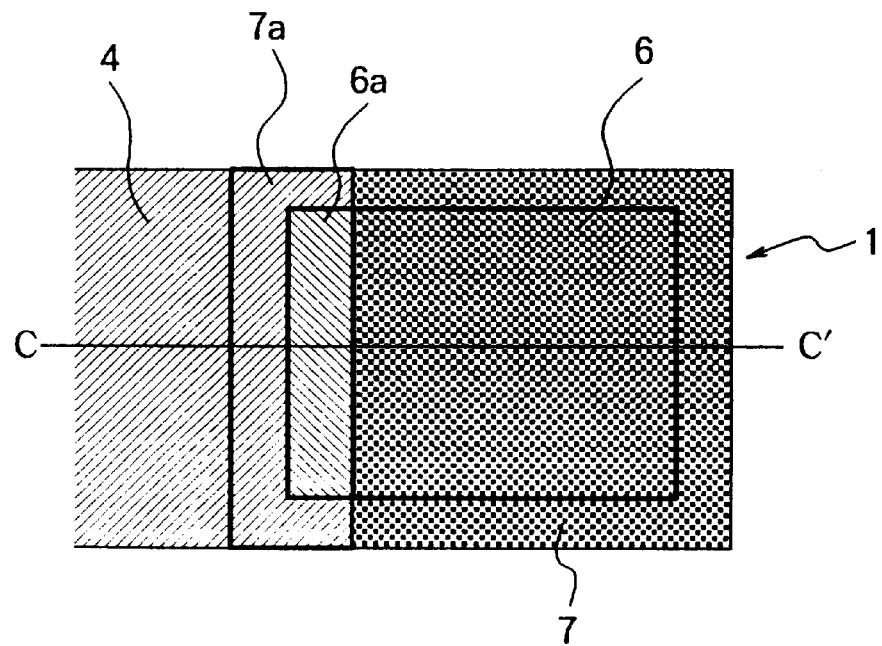
FIG. 20 is a more detailed plan view of one LED in the conventional LED array.
Figure 21:
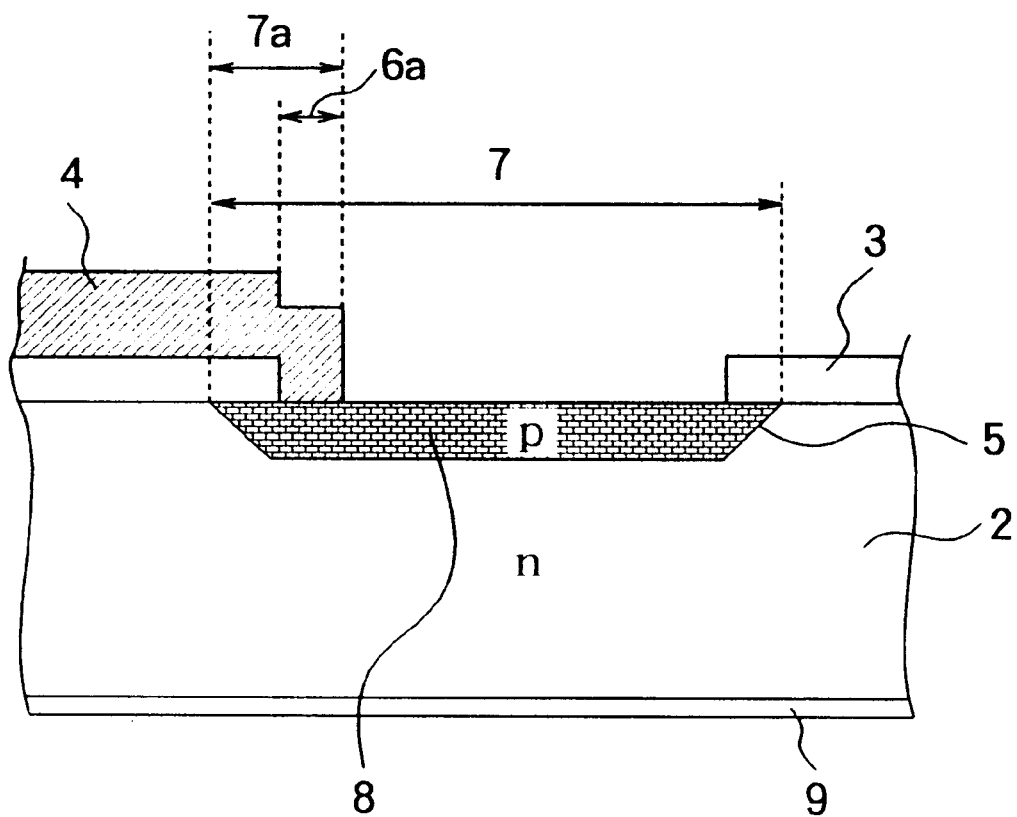
FIG. 21 is a sectional view through line C–C' in FIG. 20.

The center of the LED 80b at the end of LED array chip 7-(h−1) is separated from the center of the LED 80a at the adjacent end of LED array chip 7-h by a spacing Pch which may differ from the array pitch P within each LED array chip. This spacing Pch must not differ by too much from the array pitch P, for reasons illustrated in FIGS. 18A and 18B. The horizontal axis in FIGS. 18A and 18B represents position in the array, and the vertical axis indicates optical intensity. Referring to FIG. 18A, if Pch is much greater than P, then even when all LEDs are driven, the combined optical intensity profile T dips sharply in the gap between the two LED array chips 70-(h−1) and 70-h. The result is a light seam in the printed output. Referring to FIG. 18B, if Pch is much less than P, then when all LEDs are driven, the combined optical intensity profile U peaks sharply at the gap between LED array chips 70-(h−1) and 70-h. The result is a dark seam in the printed output.

The visibility of these light and dark seams depends partly on the material properties of the photosensitive drum and toner, but the size of Pch is the main factor. Experiments performed by the inventors indicate that a light seam will not be noticeable if Pch is equal to or less than about 1.4P, and a dark seam will not be noticeable if Pch is equal to or greater than about 0.6P. Pch should accordingly satisfy the following condition:

$$0.6P \leq Pch \leq 1.4P \tag{9}$$

Pch is equal to the sum of the gap Gch and twice the dimension $W_{10}$ shown in FIGS. 15 and 16. The gap Gch is customarily about two micrometers (2 μm), or about one-tenth of the array pitch P of twenty-one micrometers (21 μm). This relationship gives the following expression for Pch.

$$Pch = 2W_{10} + 0.1P \tag{10}$$

From conditions (9) and (10), the following condition on the dimension $W_{10}$ can be derived.

$$0.25P \leq W_{10} \leq 0.65P \tag{11}$$

A further condition is that the physical edge 81 of a LED array chip 7 must not be disposed within the p-type diffusion region 13 of the LED 80 at the end of the array. That is, the dicing process must not remove any material from the p-type diffusion region 13. Such removal would reduce the optical output of the LED 80. It is permissible for the dicing process to remove material from the p-electrode 14, which extends beyond the sides of the surface extent 17; removal of electrode material does not affect the emission characteristics of the LED 80, provided none of the p-type diffusion region 13 is removed.

From FIG. 15, it can be seen that $W_{10}$ is equal to $W_0/2 + W_{11}$. The physical edge 81 of the LED array chip is located inside the p-type diffusion region 13 if $W_{11}$ is less than zero, outside the p-type diffusion region 13 if $W_{11}$ is greater than zero, and at the edge of the p-type diffusion region 13 if $W_{11}$ is equal to zero. The necessary condition on $W_{10}$ is accordingly the following.

$$W_{10} \geq W_0/2 \tag{12}$$

Since condition (1) limits $W_0$ to a maximum value of 0.5P, condition (12) is satisfied if the following condition (13) is satisfied.

$$W_{10} \geq 0.25P \tag{13}$$

Condition (13) is part of condition (11). Accordingly, for a 1200-DPI LED array, the dimension $W_{10}$ only has to satisfy condition (11). In the present embodiment, $W_{10}$ should be in the range from five micrometers to fourteen micrometers (5 μm ≤ $W_{10}$ ≤ 14 μm). LED array chips satisfying this condition, as well as the conditions given in the first embodiment, can be assembled to form a print head for an electrophotographic printer that prints with excellent uniformity at all locations, showing no seams due to spacing between adjacent LED array chips The third embodiment can be varied by using the p-type electrode geometry of the second embodiment instead of the geometry of the first embodiment. The same condition (11) applies to the dimension $W_{10}$.

The preceding embodiments have given conditions for achieving both high contrast (MTF) and high uniformity from a high-density LED array, in particular a 1200-DPI array, by choosing the proper width for the LEDs and striking the correct balance between the covering ratio and the contact area.

Variations in the electrode geometry have been shown, but those skilled in the art will recognize that further variations are possible in this and other aspects of the invention, within the scope defined by the following claims.

What is claimed is:

1. An array of light-emitting diodes formed on a semiconductor substrate of a certain conductive type by diffusion of an impurity of an opposite conductive type to create diffusion regions disposed below windows in an insulating film covering the semiconductor substrate, having electrodes making individual electrical contact with the diffusion regions through the windows, each diffusion region, window, and electrode constituting one light-emitting diode, the light-emitting diodes being arranged in a linear array with an array pitch P in a direction of the array, wherein:

each said diffusion region has a surface extent with a width $W_0$ parallel to the direction of the array such that $$0.4P \leq W_0 \leq 0.5P.$$

2. The array of claim 1, wherein each said diffusion region has a surface extent with an area of $S_0$, of which an area of $S_2$ is covered by said electrode, and $$0.25S_0 \leq S_2 \leq 0.5S_0.$$

3. The array of claim 2, wherein said electrode makes contact with said diffusion region in a contact region with an area of $S_3$ such that $$S_3 \geq 0.4S_2.$$

4. The array of claim 2, wherein said electrode makes contact with said diffusion region in a contact region with an area of $S_3$ such that $$S_3 \geq 0.1S_0.$$

5. The array of claim 2, wherein each said window has an area of $S_1$, and said electrode makes contact with said diffusion region in a contact region with an area of $S_3$ such that $$S_3 \geq 0.2S_1.$$

6. The array of claim 1, wherein a distance $W_{10}$ from an edge of said substrate at one end of said linear array to a center of a light-emitting diode disposed at said one end of said linear array satisfies $$0.25P \leq W_{10} \leq 0.65P.$$

7. The array of claim 1, wherein each said electrode completely covers one side of said diffusion region, said side being parallel to a direction of said linear array.

8. The array of claim 1, wherein each said electrode partially covers at least one side, and not more than two sides, of said diffusion region.

9. The array of claim 1, wherein said array has at least one thousand two hundred light-emitting diodes per inch.

10. A print head comprising:
a printed circuit board; and
a plurality of arrays of light-emitting diodes according to claim 1 mounted end-to-end on said printed circuit board, forming a single combined linear array.

11. The print head of claim 10, wherein respective centers of adjacent light-emitting diodes in said combined linear array, disposed on different arrays of light-emitting diodes in said combined linear array, are separated by a distance Pch such that $$0.6P \leq Pch \leq 1.4P.$$

12. An electrophotographic printer having a photosensitive drum, a developing unit, and a transfer unit, comprising the print head of claim 10.

13. An array of light-emitting diodes formed on a semiconductor substrate of a certain conductive type by diffusion of an impurity of an opposite conductive type to create diffusion regions disposed below windows in an insulating film covering the semiconductor substrate, having electrodes making individual electrical contact with the diffusion regions through the windows, each diffusion region, window, and electrode constituting one light-emitting diode, the light-emitting diodes being arranged in a linear array with an array pitch P, wherein:
each said window has a width $W_1$ parallel to the direction of the array such that $$0.3P \leq W_1 \leq 0.4P.$$

14. The array of claim 13, wherein each said diffusion region has a surface extent with an area of $S_0$, of which an area of $S_2$ is covered by said electrode, and $$0.25S_0 \leq S_2 \leq 0.5S_0.$$

15. The array of claim 14, wherein said electrode makes contact with said diffusion region in a contact region with an area of $S_3$ such that $$S_3 \geq 0.4S_2.$$

16. The array of claim 14, wherein said electrode makes contact with said diffusion region in a contact region with an area of $S_3$ such that $$S_3 \geq 0.1S_0.$$

17. The array of claim 14, wherein each said window has an area of $S_1$, and said electrode makes contact with said diffusion region in a contact region with an area of $S_3$ such that $$S_3 \geq 0.2S_1.$$

18. The array of claim 13, wherein a distance $W_{10}$ from an edge of said substrate at one end of said linear array to a center of a light-emitting diode disposed at said one end of said linear array satisfies $$0.25P \leq W_{10} \leq 0.65P.$$

19. The array of claim 13, wherein each said electrode completely covers one side of said diffusion region, said side being parallel to a direction of said linear array.

20. The array of claim 13, wherein each said electrode partially covers at least one side, and not more than two sides, of said diffusion region.

21. The array of claim 13, wherein said array has at least one thousand two hundred light-emitting diodes per inch.

22. A print head comprising:
a printed circuit board; and
a plurality of arrays of light-emitting diodes according to claim 13 mounted end-to-end on said printed circuit board, forming a single combined linear array.

23. The print head of claim 22, wherein respective centers of adjacent light-emitting diodes in said combined linear array, disposed on different arrays of light-emitting diodes in said combined linear array, are separated by a distance Pch such that $$0.6P \leq Pch \leq 1.4P.$$

24. An electrophotographic printer having a photosensitive drum, a developing unit, and a transfer unit, comprising the print head of claim 22.

25. An array of light-emitting diodes formed on a semiconductor substrate of a certain conductive type by diffusion of an impurity of an opposite conductive type to create diffusion regions disposed below windows in an insulating film covering the semiconductor substrate, having electrodes making individual electrical contact with the diffusion regions through the windows, each diffusion region, window, and electrode constituting one light-emitting diode, the light-emitting diodes being arranged in a linear array with an array pitch P, wherein:
each said diffusion region has a surface extent with an area of $S_0$, of which an area or $S_2$ is covered by said electrode, and $$0.25S_0 \leq S_2 \leq 0.5S_0.$$

26. The array of claim 25, wherein said electrode makes contact with said diffusion region in a contact region with an area of $S_3$ such that $$S_3 \geq 0.4S_2.$$

27. The array of claim 25, wherein said electrode makes contact with said diffusion region in a contact region with an area of $S_3$ such that $$S_3 \geq 0.1S_0.$$

28. The array of claim 25, wherein each said window has an area of $S_1$, and said electrode makes contact with said diffusion region in a contact region with an area of $S_3$ such that $$S_3 \geq 0.2S_1.$$

29. The array of claim 25, wherein a distance $W_{10}$ from an edge of said substrate at one end of said linear array to a center of a light-emitting diode disposed at said one end of said linear array satisfies $$0.25P \leq W_{10} \leq 0.65P.$$

30. The array of claim 25, wherein each said electrode completely covers one side of said diffusion region, said side being parallel to a direction of said linear array.

31. The array of claim 25, wherein each said electrode partially covers at least one side, and not more than two sides, of said diffusion region.

32. The array of claim 25, wherein said array has at least one thousand two hundred light-emitting diodes per inch.

33. A print head comprising:
a printed circuit board; and
a plurality of arrays of light-emitting diodes according to claim 25 mounted end-to-end on said printed circuit board, forming a single combined linear array.

34. The print head of claim 33, wherein respective centers of adjacent light-emitting diodes in said combined linear array, disposed on different arrays of light-emitting diodes in said combined linear array, are separated by a distance Pch such that $0.6P \leq Pch \leq 1.4P$.

35. An electrophotographic printer having a photosensitive drum, a developing unit, and a transfer unit, comprising the print head of claim 33.

36. An array of light-emitting diodes formed on a semiconductor substrate, the light-emitting diodes being arranged in a linear array with an array pitch P, wherein:

a distance $W_{10}$ from an edge of said substrate at one end of said linear array to a center of a light-emitting diode disposed at said one end of said linear array satisfies $0.25P \leq W_{10} \leq 0.65P$.

37. The array of claim 36, wherein each said electrode completely covers one side of said diffusion region, said side being parallel to a direction of said linear array.

38. The array of claim 36, wherein each said electrode partially covers at least one side, and not more than two sides, of said diffusion region.

39. The array of claim 36, wherein said array has at least one thousand two hundred light-emitting diodes per inch.

40. A print head comprising:

a printed circuit board; and a plurality of arrays of light-emitting diodes according to claim 36 mounted end-to-end on said printed circuit board, forming a single combined linear array.

41. The print head of claim 40, wherein respective centers of adjacent light-emitting diodes in said combined linear array, disposed on different arrays of light-emitting diodes in said combined linear array, are separated by a distance Pch such that $0.6P \leq Pch \leq 1.4P$.

42. An electrophotographic printer having a photosensitive drum, a developing unit, and a transfer unit, comprising the print head of claim 40.

* * * * *